United States Patent
Chen et al.

(10) Patent No.: US 11,081,560 B2
(45) Date of Patent: Aug. 3, 2021

(54) SEMICONDUCTOR DEVICES AND METHODS FOR FORMING THE SAME

(71) Applicant: Vanguard International Semiconductor Corporation, Hsinchu (TW)

(72) Inventors: Tsung-Yeh Chen, Taipei (TW); Sheng-Wei Fu, Taoyuan (TW); Chung-Yeh Lee, Sinpu Township, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 46 days.

(21) Appl. No.: 16/800,272

(22) Filed: Feb. 25, 2020

(65) Prior Publication Data

US 2020/0194564 A1    Jun. 18, 2020

Related U.S. Application Data

(62) Division of application No. 16/005,161, filed on Jun. 11, 2018, now Pat. No. 10,615,263.

(51) Int. Cl.
*H01L 29/66* (2006.01)
*H01L 29/423* (2006.01)
(Continued)

(52) U.S. Cl.
CPC ........ *H01L 29/4236* (2013.01); *H01L 29/407* (2013.01); *H01L 29/4238* (2013.01);
(Continued)

(58) Field of Classification Search
CPC ......... H01L 29/66734; H01L 29/66666; H01L 21/823437; H01L 21/823456; H01L 21/823487
See application file for complete search history.

(56) References Cited

U.S. PATENT DOCUMENTS

| 2010/0123192 A1 | 5/2010 | Burke et al. |
| 2014/0015041 A1* | 1/2014 | Chan ............... H01L 29/407 257/330 |

(Continued)

FOREIGN PATENT DOCUMENTS

| TW | 200705680 A | 2/2007 |
| TW | 201203389 A1 | 1/2012 |

OTHER PUBLICATIONS

Taiwanese Office Action and Search Report for Taiwanese Application No. 107112882, dated Jul. 10, 2018.

*Primary Examiner* — Jae Lee
(74) *Attorney, Agent, or Firm* — Birch, Stewart, Kolasch & Birch LLP (57) ABSTRACT

A semiconductor device and methods for forming the same are provided. The method includes providing a substrate having a first conductive type, forming an epitaxial layer having the first conductive type on the substrate, forming a trench in the epitaxial layer, forming a first insulating layer in the trench and on the top surface of the epitaxial layer, forming a shield electrode and a mask layer on the first insulating layer in order, using the mask layer to remove a portion of the first insulating layer, wherein the top surface of the first insulating layer is higher than the top surface of the shield electrode after removing the portion of the first insulating layer, removing the mask layer, forming a second insulating layer on the first insulating layer and the shield electrode, and forming a gate electrode on the second insulating layer.

10 Claims, 6 Drawing Sheets

(51) Int. Cl.
*H01L 29/40* (2006.01)
*H01L 29/78* (2006.01)

(52) U.S. Cl.
CPC .. *H01L 29/42364* (2013.01); *H01L 29/66727* (2013.01); *H01L 29/66734* (2013.01); *H01L 29/7813* (2013.01)

(56) References Cited

U.S. PATENT DOCUMENTS

2016/0197176 A1 7/2016 Stefanov et al.
2016/0284838 A1 9/2016 Qin et al.
2017/0213908 A1 7/2017 Fursin et al.

\* cited by examiner

SEMICONDUCTOR DEVICES AND METHODS FOR FORMING THE SAME

CROSS REFERENCE TO RELATED APPLICATION

This application is a Divisional of copending application Ser. No. 16/005,161, filed on Jun. 11, 2018, the entirety of which is incorporated by reference herein.

BACKGROUND

Field of the Invention

The embodiments of the invention relate to semiconductor technology, and in particular to split-gate trench power metal oxide semiconductor field-effect transistors (trench power MOSFET) and methods for forming the same.

Description of the Related Art

Technology that includes high-voltage elements is implemented into integrated circuits with high voltages and high power. In order to achieve a high-withstand voltage and high current, the flow of the driving current in a conventional power transistor has been developed from a horizontal direction to a vertical direction. A metal oxide semiconductor field-effect transistor (MOSFET) having a trench gate has been developed that is capable of effectively reducing on-resistance (Ron) and processing high currents.

A split-gate trench structure has recently been developed. The split-gate trench power metal oxide semiconductor field-effect transistor mainly comprises two electrodes vertically disposed in the gate trench. One electrode acts as a gate electrode and mainly controls the formation of the current channel of the metal oxide semiconductor field-effect transistor. The other electrode acts as a shield electrode located directly below the gate electrode and can reduce the parasitic capacitance between the drain electrode and the gate electrode. However, IGSSR leakage is likely to occur when forming the split-gate trench structure.

Therefore, it is necessary to search for split-gate trench power metal oxide semiconductor field effect transistors and methods for forming the same that can minimize or solve the above problems.

BRIEF SUMMARY

According to some embodiments of the invention, a method for forming a semiconductor device is provided. The method includes providing a substrate having a first conductive type, forming an epitaxial layer having the first conductive type on the substrate, forming a trench in the epitaxial layer, forming a first insulating layer in the trench and on the top surface of the epitaxial layer, forming a shield electrode and a mask layer on the first insulating layer in order, using the mask layer to remove a portion of the first insulating layer, wherein the top surface of the first insulating layer is higher than the top surface of the shield electrode after removing the portion of the first insulating layer, removing the mask layer, forming a second insulating layer on the first insulating layer and the shield electrode, forming a gate electrode on the second insulating layer, forming a well region having a second conductive type in the epitaxial layer, the second conductive type is different from the first conductive type, and forming a heavily doped region having the first conductive type in the well region.

According to some embodiments of the invention, a semiconductor device is provided. The semiconductor device includes a substrate having a first conductive type. An epitaxial layer having the first conductive type is disposed on the substrate, and a trench is in the epitaxial layer. A well region is disposed on the epitaxial layer and having a second conductive type that is different from the first conductive type. A heavily doped region having the first conductive type is disposed on the well region. A shield electrode is disposed in the trench, wherein the shield electrode is separated from the epitaxial layer by a first insulating layer, and the top surface of the first insulating layer is higher than the top surface of the shield electrode. The semiconductor device also includes a gate electrode disposed in the trench and over the shield electrode, wherein the gate electrode is separated from the epitaxial layer and the shield electrode by a second insulating layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is about semiconductor devices and methods for forming the same according to embodiments of the disclosure. However, it should be appreciated that the embodiments of the disclosure provide lots of suitable concepts of the invention and can be performed in a wide variety of specific backgrounds. The specific embodiments of the disclosure are used to explain the fabrication by specific methods and use of the invention and should not be taken in a limiting sense. The scope of the invention is best determined by reference to the appended claims. Moreover, the same or similar elements in the drawings and the description are labeled with the same reference numbers.

Referring to FIGS. 1A-1L, they show cross sections of various stages of a method for forming a semiconductor device 100 according to some embodiments of the invention. Additional operations can be provided before, during or after the steps of the embodiments. In different embodiments, some operations can be moved, omitted or replaced. Additional features can be added to the semiconductor device. In different embodiments, some features described below can be moved, omitted or replaced.

Figure 1A:
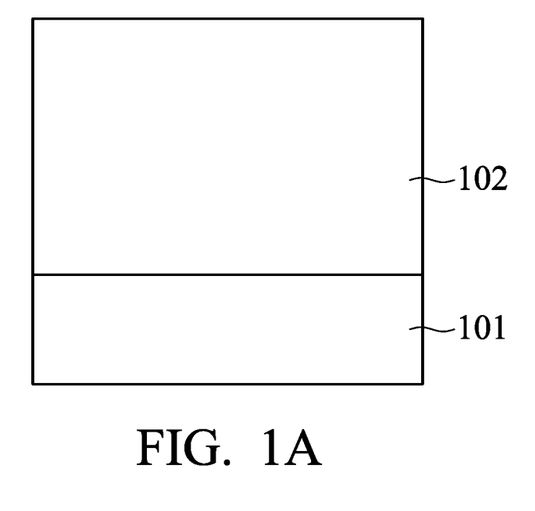
FIGS. 1A-1L show cross sections of various stages of a method for forming a semiconductor device according to some embodiments of the invention.

According to some embodiments, as shown in FIG. 1A, a substrate 101 having a first conductive type is provided, and the substrate 101 acts as the drain (D) of the semiconductor device 100. In some embodiments, the substrate 101 is made of silicon or another semiconductor material. Alternatively, the substrate 101 can include another element semiconductor material, such as germanium (Ge). In some embodiments, the substrate 101 can be made of compound semiconductor, such as silicon carbide, gallium nitride, gallium arsenide, indium arsenide or indium phosphide. In some embodiments, the substrate 101 can be made of alloy semiconductor, such as silicon germanium, silicon germanium carbide, arsenic gallium phosphide or indium gallium phosphide. In some embodiments, the substrate 101 includes silicon-on-insulator (SOI) substrate or another suitable substrate. In the embodiment, the first conductive type is n-type, but it is not limited thereto. In other embodiments, the first conductive type can be p-type.

Next, according to some embodiments, an epitaxial growth process is performed. An epitaxial layer 102 is formed on the substrate 101. The substrate 101 and the epitaxial layer 102 have the same conductive type, such as the first conductive type. In the embodiment, the epitaxial layer 102 is n-type. In some embodiments, the epitaxial growth process can be metal organic chemical vapor deposition (MOCVD), plasma-enhanced CVD (PECVD), molecular beam epitaxy (MBE), hydride vapour phase epitaxy (HYPE), liquid phase epitaxy (LPE), chloride vapour phase epitaxy (Cl-VPE), another suitable process or a combination thereof.

Figure 1B:
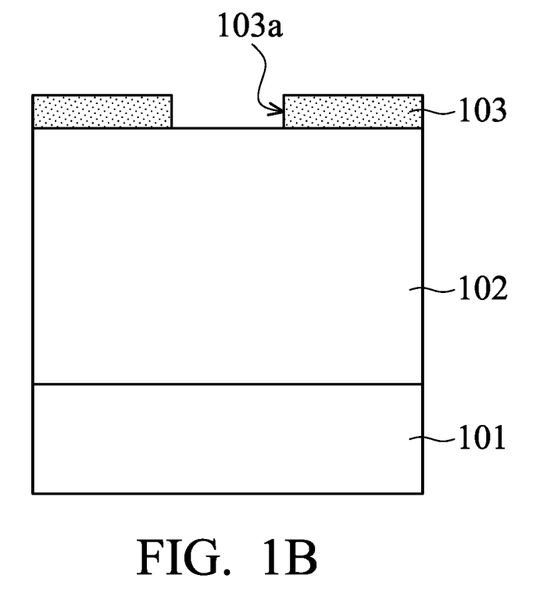

Next, according to some embodiments, as shown in FIG. 1B, a patterned mask 103 is formed on the epitaxial layer 102 through a lithography patterning process. The patterned mask 103 has an opening 103a. In the embodiment, the material of the patterned mask 103 can be photoresist material. In other embodiments, the material of the patterned mask 103 can be a hard mask made of an oxide layer and a nitride layer. In some embodiments, the lithography patterning process includes photoresist coating (for example, spin-coating), soft baking, mask aligning, exposing, post-exposure baking, photoresist developing, washing and drying (for example, hard baking), another suitable process, or a combination thereof.

Figure 1C:
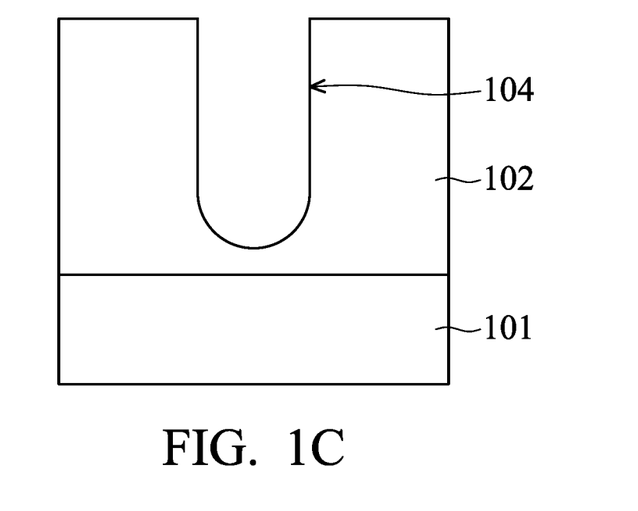

According to some embodiments, as shown in FIG. 1C, after forming the patterned mask 103, an etching process is performed on the epitaxial layer 102 through the first opening 103a of the patterned mask 103 to form a trench 104 in the epitaxial layer 102. In some embodiments, the etching process may be dry etch process, wet etch process, plasma etching process, reactive ion etching process, another suitable process or a combination thereof. After forming the trench 104, the patterned mask 103 is removed. It should be understood that the size, shape and location of the trench 104 shown in FIG. 1C is only an example of the embodiments, but it is not limited thereto.

Figure 1D:
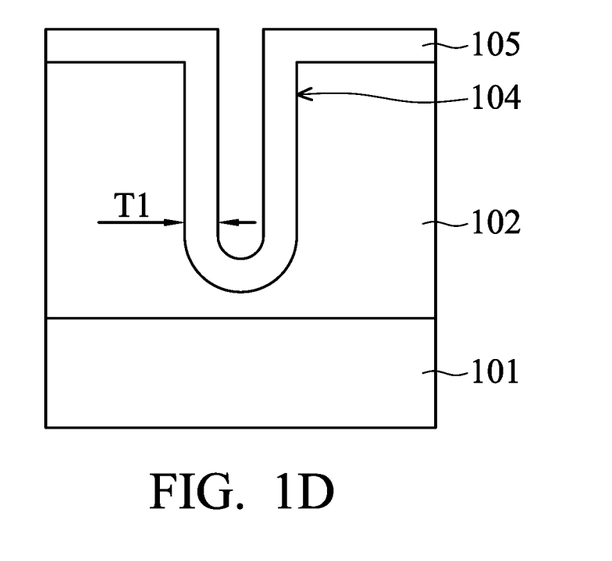

According to some embodiments, as shown in FIG. 1D, a first insulating layer 105 is formed in the trench 104 and on the top surface of the epitaxial layer 102 by an oxidation process, and an annealing process is performed on the first insulating layer 105 to increase the density of the first insulating layer 105. In some embodiments, the first insulating layer 105 has a uniform thickness T1. In some embodiments, the thickness T1 is in a range between 50 nm and 500 nm. The thickness T1 of the insulating layer 105 may be determined according to element size and design requirements of the semiconductor device. In some embodiments, the insulating layer 105 may be silicon oxide, germanium oxide, another suitable semiconductor oxide material or a combination thereof. In some embodiments, the oxidation process may be thermal oxidation, radical oxidation or another suitable process. In some embodiments, the annealing process may be a rapid thermal annealing (RTA) process.

Figure 1E:
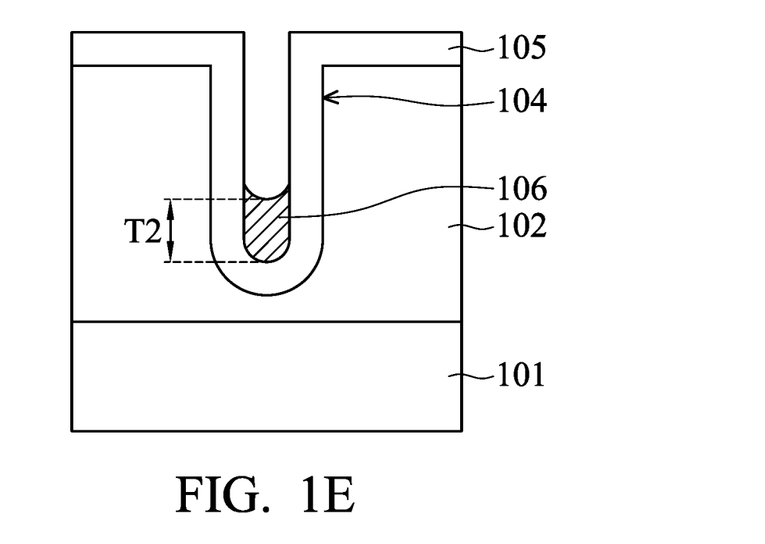

According to some embodiments, as shown in FIG. 1E, a shield electrode 106 is formed on the first insulating layer 105 in the trench 104 by a deposition process, lithography patterning process and etching process. In the embodiment, the shield electrode 106 fills the lower portion of the trench 104 but it does not completely fill the trench 104, and the shield electrode 106 is surrounded by the first insulating layer 105. In some embodiments, the shield electrode 106 has a uniform thickness T2. In some embodiments, the thickness T2 is in a range between 500 nm and 5000 nm. The thickness T2 of the shield electrode 106 may be determined according to element size and design requirements of the semiconductor device. In some embodiments, the material of the shield electrode 106 may be a single layer or multiple layers structure and is formed of amorphous silicon, polysilicon, one or more metals, metal nitride, metal silicide, conductive metal oxide or a combination thereof. Specifically, the above-mentioned metal may comprise Mo, W, Ti, Ta, Pt or Hf, but it is not limited thereto. The above-mentioned metal nitride may comprise MoN, WN, TiN and TaN, but it is not limited thereto. The above-mentioned metal silicide may comprise $WSi_x$. The above-mentioned conductive metal oxide may comprise $RuO_2$ and indium tin oxide (ITO), but it is not limited thereto. In some embodiments, the deposition process may be physical vapor deposition (PVD), chemical vapor deposition (CVD), another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be dry etch process, wet etch process, plasma etching process, reactive ion etching process, another suitable process or a combination thereof.

Figure 1F:
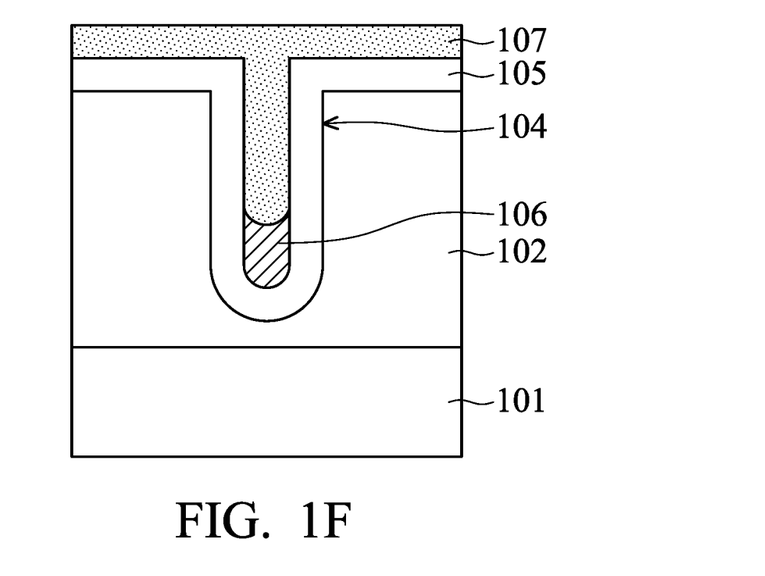

Next, according to some embodiments, as shown in FIG. 1F, a mask material layer 107 is formed on the first insulating layer 105 and the shield electrode 106. In some embodiments, the mask material layer 107 completely fills the remaining portion of the trench 104. In some embodiments, the material of the mask material layer 107 is the same as that of the patterned mask 103. In some embodiments, the mask material layer 107 is formed by the deposition process or coating process.

Figure 1G:
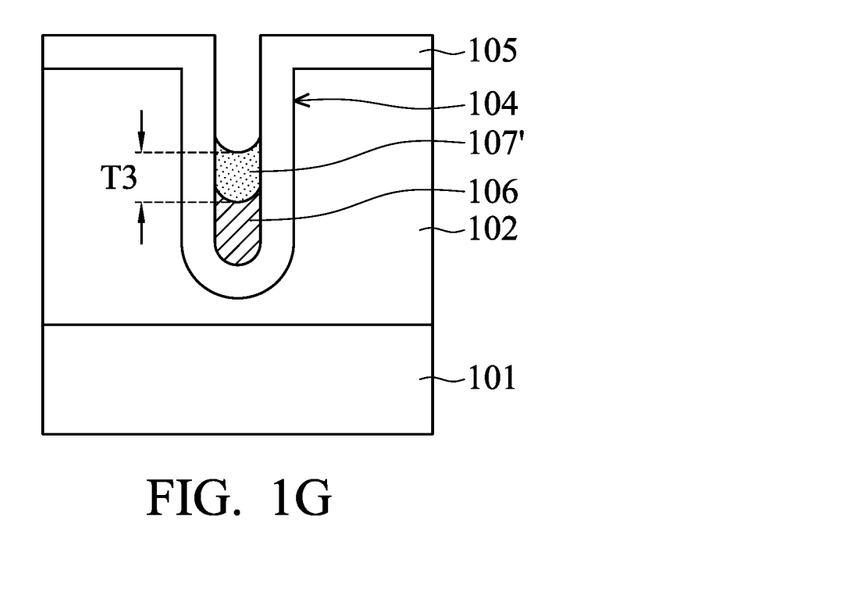

According to some embodiments, as shown in FIG. 1G, a portion of the mask material layer 107 is removed to form a mask layer 107', and the remaining space of the trench 104 is kept on the mask layer 107'. In some embodiments, the mask layer 107' is surrounded by the first insulating layer 105. In some embodiments, the mask layer 107' has a uniform thickness T3. In some embodiments, the thickness T3 is in a range between 50 nm and 500 nm. The thickness T3 of the mask layer 107' may be determined according to element size and design requirements of the semiconductor device. In some embodiments, the thickness T3 of the mask layer 107' is smaller than the thickness T2 of the shield electrode 106.

Figure 1H:
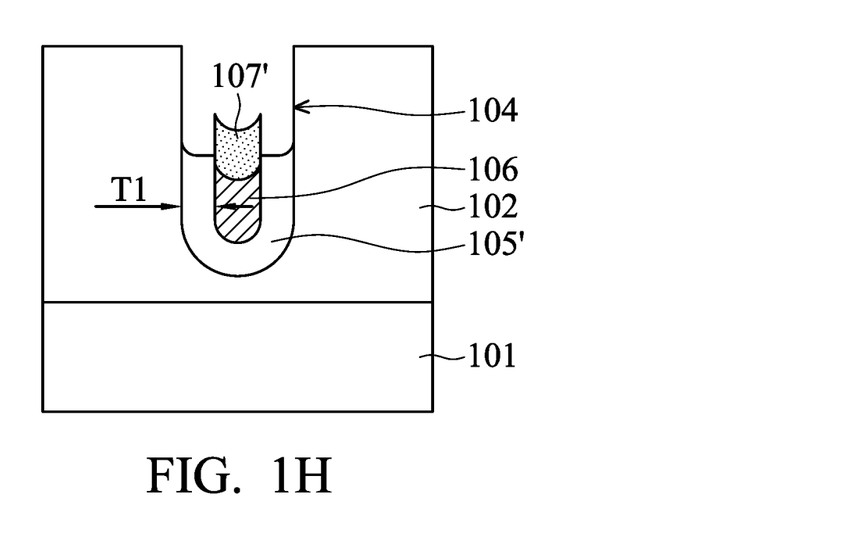

Next, according to some embodiments, as shown in FIG. 1H, a portion of the first insulating layer 105 is removed by using the mask layer 107' as a mask, and a first insulating layer 105' is kept. In the embodiment, the top surface of the first insulating layer 105' is higher than the top surface of the shield electrode 106, and the top surface of the first insulating layer 105' is lower than the top surface of the mask layer 107'. In some embodiments, the first insulating layer 105' also has a uniform thickness T1. In some embodiments, during the removing process, the portion of the first insulating layer 105 on the top surface of the epitaxial layer 102 and the upper portion of the first insulating layer 105 in the trench are removed to expose a portion of the epitaxial layer 102 in the trench 104. In the embodiment, after forming the first insulating layer 105', the mask layer 107' is removed.

Figure 1I:
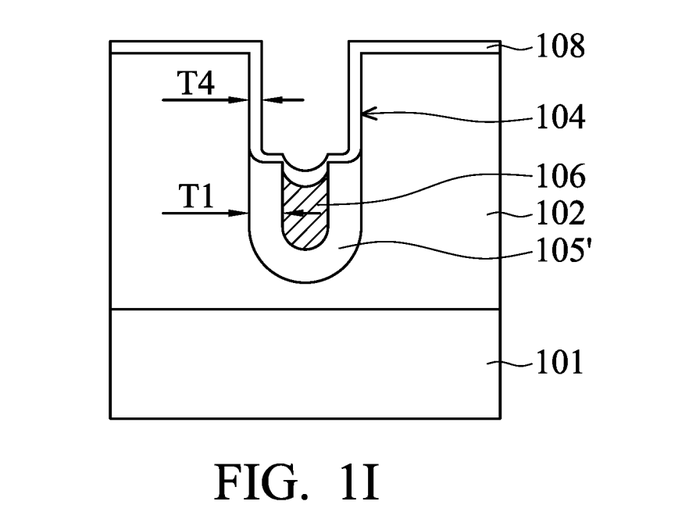

According to some embodiments, as shown in FIG. 1I, a second insulating layer 108 is formed on the epitaxial layer 102, the first insulating layer 105' and the shield electrode 106 by a deposition process. In some embodiments, the second insulating layer 108 has a uniform thickness T4. In some embodiments, the thickness T4 is in a range between 10 nm and 200 nm. The thickness T4 of the second insulating layer 108 may be determined according to element size and design requirements of the semiconductor device. In some embodiments, the thickness T1 of the first insulating layer 105' (or first insulating layer 105) is greater than the thickness T4 of the second insulating layer 108. In the embodiment, the second insulating layer 108 forms a stepped upper surface on the first insulating layer 105' and the shield electrode 106, and the first portion of the second insulating layer 108 on the first insulating layer 105' is higher than the second portion of the second insulating layer 108 on the shield electrode 106. In other embodiments, the second insulating layer 108 forms a U-shaped upper surface on the first insulating layer 105' and the shield electrode 106. In some embodiments, the second insulating layer 108 may be silicon oxide, hafnium oxide, zirconium oxide, aluminum oxide, aluminum hafnium dioxide, silicon hafnium dioxide, silicon hafnium oxynitride, tantalum hafnium oxide, titanium hafnium oxide, zirconium hafnium oxide, another suitable high-k dielectric material or a combination thereof. In some embodiments, the material of the second insulating layer 108 is different from that of the first insulating layer 105'. In other embodiments, the material of the second insulating layer 108 is the same as that of the first insulating layer 105'. In the embodiment, the deposition process is a conformal deposition process and may be physical vapor deposition (PVD), chemical vapor deposition (CVD), another suitable process or a combination thereof.

Figure 1J:
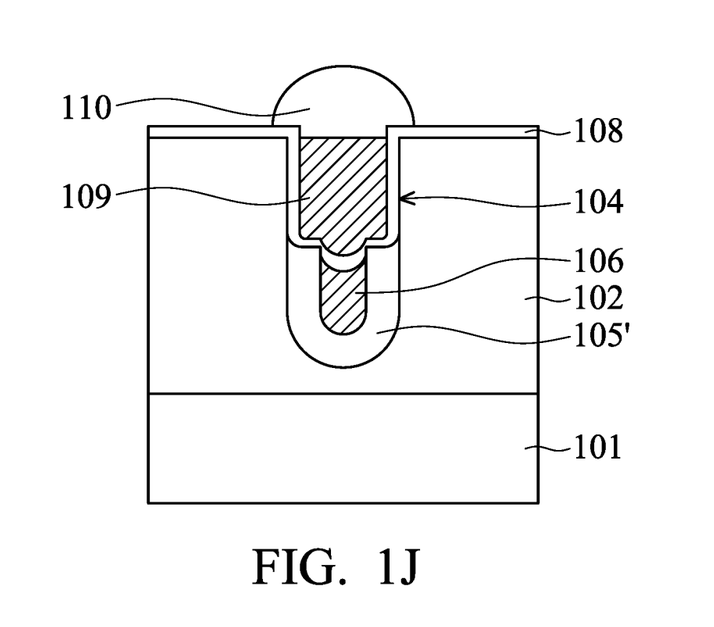

According to some embodiments, as shown in FIG. 1J, a gate electrode 109 is formed on the second insulating layer 108 in the trench 104 by a deposition process, lithography patterning process and etching process. In some embodiments, the material of the gate electrode 109 is the same as that of the shield electrode 106. In some embodiments, the deposition process may be physical vapor deposition (PVD), chemical vapor deposition (CVD), another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be dry etch process, wet etch process, plasma etching process, reactive ion etching process, another suitable process or a combination thereof.

Due to the deposition of the mask layer 107', excessive removal of the first insulating layer 105 can be avoided during the removal of a portion of the first insulating layer 105 (i.e. the undercut effect of the first insulating layer 105 can be avoided). In other words, by the deposition of the mask layer 107', after removing a portion of the first insulating layer 105, the top surface of the remaining portion of the first insulating layer 105 may be higher than the top surface of the shield electrode 106. Therefore, after depositing the second insulating layer 108, the IGSSR leakage is less likely to occur on the profile of the second insulating layer 108 formed on the first insulating layer 105' and the shield electrode 106. In addition, the profile of the second insulating layer 108 formed on the first insulating layer 105' and the shield electrode 106 can also reduce the Qgd, thereby improving the performance of the semiconductor device.

According to some embodiments, as shown in FIG. 1J, a third insulating layer 110 is formed on the gate electrode 109 by a deposition process, lithography patterning process and etching process. In some embodiments, the material of the third insulating layer 110 is different from that of the second insulating layer 108. In other embodiments, the material of the third insulating layer 110 is the same as that of the second insulating layer 108. In some embodiments, the deposition process may be physical vapor deposition (PVD), chemical vapor deposition (CVD), another suitable process or a combination thereof. In some embodiments, the lithography patterning process may include photoresist coating (for example, spin-coating), soft baking, mask aligning, exposing, post-exposure baking, photoresist developing, washing and drying (for example, hard baking), another suitable process, or a combination thereof. In some embodiments, the etching process may be dry etch process, wet etch process, plasma etching process, reactive ion etching process, another suitable process or a combination thereof.

Figure 1K:
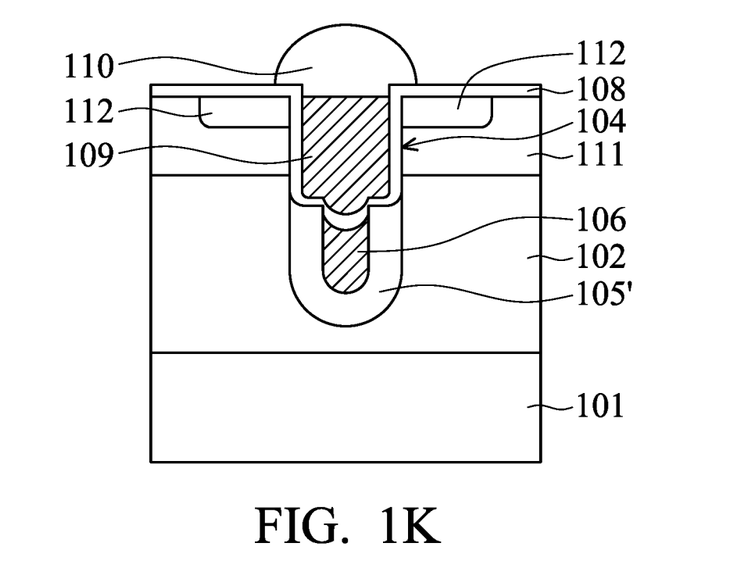

Next, according to some embodiments, as shown in FIG. 1K, a well region 111 is formed in the epitaxial layer 102 by a doping process (for example, an ion implantation process), and a heavily doped region 112 is formed in the well region 111 by another doping process (for example, an ion implantation process). According to some embodiments, the well region 111 acts as the channel region of the semiconductor device 100, and the heavily doped region 112 acts as the source (S) of the semiconductor device 100. In the embodiment, the trench 104 is surrounded by the well region 111 and the heavily doped region 112. In the embodiment, the well region 111 has a second conductive type that is different from that of the substrate 101, and the heavily doped region 112 has the first conductive type that is the same as that of the substrate 101. In the embodiment, the second conductive type is p-type, but it is not limited thereto. In other embodiments, the second conductive type may be n-type. In some embodiments, the doping concentration of the heavily doped region 112 is greater than that of the substrate 101 and the epitaxial layer 102.

Figure 1L:
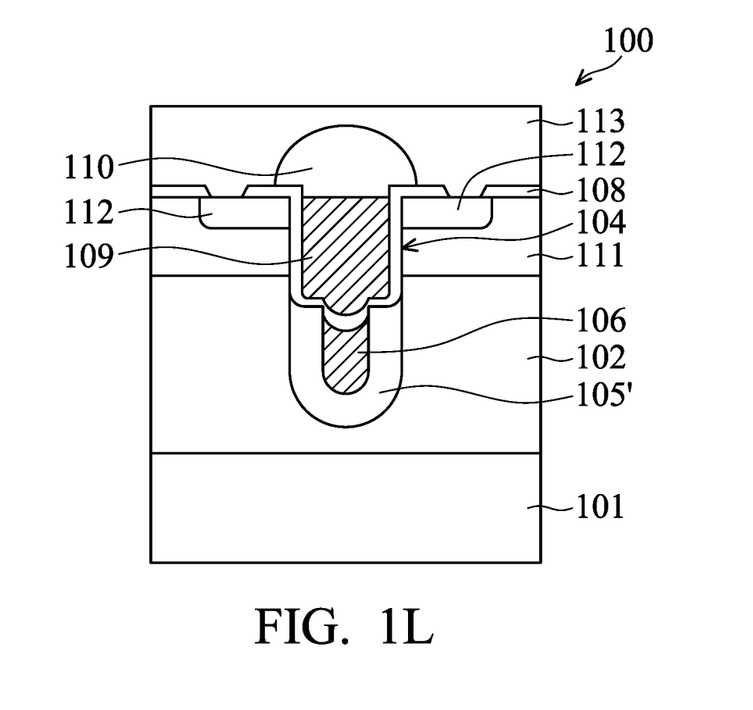

According to some embodiments, as shown in FIG. 1L, a first metal layer 113 is formed on the second insulating layer 108 and the third insulating layer 110 by a deposition process. The first metal layer 113 penetrates the second insulating layer 108 to electrically connect to the heavily doped region 112. In some embodiments, the first metal layer 113 may be Ag, Cu, Au, Pt, W, Po or another suitable conductive material. In some embodiments, the deposition process may be physical vapor deposition (PVD), chemical vapor deposition (CVD), another suitable process or a combination thereof.

In some embodiments, a second metal layer (not shown) is formed on the third insulating layer 110 by a deposition process. The second metal layer is through the third insulating layer 110, the gate electrode 109 and the second insulating layer 108 to electrically connect to the gate electrode 109 and the shield electrode 106. In some embodiments, the second metal layer may be Ag, Cu, Au, Pt, W, Po or another suitable conductive material. In some embodiments, the deposition process may be physical vapor deposition (PVD), chemical vapor deposition (CVD), another suitable process or a combination thereof. After forming the first metal layer 113 and the second metal layer, the process for forming the semiconductor device 100 is complete.

According to some embodiments of the invention, due to the deposition of the mask layer, excessive removal of the first insulating layer can be avoided during the removal of a portion of the first insulating layer (i.e. the undercut effect of the first insulating layer 105 can be avoided). In other words, thanks to the deposition of the mask layer, after removing a portion of the first insulating layer, the top surface of the remaining portion of the first insulating layer may be higher than the top surface of the shield electrode. Therefore, after depositing the second insulating layer, the IGSSR leakage is less likely to occur on the profile of the second insulating layer formed on the first insulating layer and the shield electrode. In addition, the profile of the second insulating layer formed on the first insulating layer and the shield electrode can also reduce the Qgd, thereby improving the performance of the semiconductor device.

While the disclosure has been described by way of example and in terms of the embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate having a first conductive type;
   forming an epitaxial layer having the first conductive type on the substrate;
   forming a trench in the epitaxial layer;
   forming a first insulating layer in the trench and on a top surface of the epitaxial layer;
   forming a shield electrode and a mask layer on the first insulating layer in order;
   using the mask layer to remove a portion of the first insulating layer, wherein a top surface of the first insulating layer is higher than a top surface of the shield electrode after removing the portion of the first insulating layer;
   removing the mask layer;
   forming a second insulating layer on the first insulating layer and the shield electrode;
   forming a gate electrode on the second insulating layer;
   forming a well region having a second conductive type in the epitaxial layer, wherein the second conductive type is different from the first conductive type; and
   forming a heavily doped region having the first conductive type in the well region.

2. The method of claim 1, wherein forming the shield electrode and the mask layer comprises:
   filling the shield electrode in the lower portion of the trench;
   forming a mask material layer on the shield electrode, wherein the mask material layer completely fills the trench; and
   removing a portion of the mask material layer to form the mask layer, and a remaining space of the trench is kept on the mask layer.

3. The method of claim 1, wherein the thickness of the mask layer is smaller than the thickness of the shield electrode.

4. The method of claim 1, wherein the epitaxial layer in the trench is exposed after removing the portion of the first insulating layer.

5. The method of claim 1, wherein the portion of the first insulating layer includes a portion of the first insulating layer on the top surface of the epitaxial layer and an upper portion of the first insulating layer in the trench.

6. The method of claim 1, wherein the shield electrode and the mask layer are surrounded by the first insulating layer.

7. The method of claim 1, wherein the second insulating layer forms a U-shaped upper surface on the first insulating layer and the shield electrode.

8. The method of claim 1, wherein the second insulating layer forms a stepped upper surface on the first insulating layer and the shield electrode, and a first portion of the second insulating layer on the first insulating layer is higher than a second portion of the second insulating layer on the shield electrode.

9. The method of claim 1, wherein the thickness of the first insulating layer is greater than the thickness of the second insulating layer.

10. The method of claim 1, further comprising:
    forming a third insulating layer on the gate electrode; and
    forming a first metal layer and a second metal layer on the third insulating layer, wherein the first metal layer is electrically connected to the heavily doped region, and the second metal layer is electrically connected to the gate electrode and the shield electrode.

* * * * *